(12) United States Patent
Fan et al.

(10) Patent No.: US 8,203,352 B2
(45) Date of Patent: Jun. 19, 2012

(54) SINGLE SUPPORT STRUCTURE PROBE GROUP WITH STAGGERED MOUNTING PATTERN

(75) Inventors: Li Fan, San Ramon, CA (US); John K. Gritters, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 12/861,984

(22) Filed: Aug. 24, 2010

(65) Prior Publication Data
US 2010/0315111 A1 Dec. 16, 2010

Related U.S. Application Data

(62) Division of application No. 11/535,859, filed on Sep. 27, 2006, now Pat. No. 7,782,072.

(51) Int. Cl.
G01R 31/00 (2006.01)
G01R 1/067 (2006.01)

(52) U.S. Cl. .............. 324/754.01; 324/755.07

(58) Field of Classification Search ......... 324/754.01–754.29, 762.01–762.09, 324/755.05–755.11, 756.01–756.03; 257/48; 438/14–18
See application file for complete search history.

(56) References Cited

U.S. PATENT DOCUMENTS

| | | | |
|---|---|---|---|
| 4,599,559 A * | 7/1986 | Evans | 324/754.2 |
| 6,198,297 B1 * | 3/2001 | Riccioni | 324/754.07 |
| 6,268,015 B1 | 7/2001 | Mathieu et al. | |
| 6,414,501 B2 | 7/2002 | Kim et al. | |
| 6,520,778 B1 | 2/2003 | Eldridge et al. | |
| 6,791,171 B2 | 9/2004 | Mok et al. | |
| 6,933,738 B2 * | 8/2005 | Martin et al. | 324/750.25 |
| 7,091,729 B2 * | 8/2006 | Kister | 324/755.07 |
| 7,432,726 B2 | 10/2008 | Ueno et al. | |
| 7,782,072 B2 | 8/2010 | Fan et al. | |

FOREIGN PATENT DOCUMENTS

| | | |
|---|---|---|
| CN | 1329721 | 1/2002 |
| EP | 1316803 | 6/2003 |
| EP | 1659410 | 5/2006 |

OTHER PUBLICATIONS

International Preliminary Report on Patentability PCT/US07/079611.
PCT Search Report PCT/US07/079611.

* cited by examiner

Primary Examiner — Jermele M Hollington
Assistant Examiner — Tung X Nguyen
(74) Attorney, Agent, or Firm — Kirton McConkie

(57) ABSTRACT

A probe group can include multiple probes for testing devices having contact pads. The probes can comprise beams, contact tip structures, and mounting portions. The beams can provide for controlled deflection of the probes. The contact tip structures can be connected to the beams and can include contact portions for contacting with the devices. The mounting portions of the beams can be attached to support structures, which can be arranged in a staggered pattern. The beams located in a first row of the staggered pattern can include narrowing regions that lie substantially in line with the mounting portions of a second row of the beams.

26 Claims, 12 Drawing Sheets

SINGLE SUPPORT STRUCTURE PROBE GROUP WITH STAGGERED MOUNTING PATTERN

CROSS-REFERENCE TO RELATED APPLICATION(S)

This application is a division of U.S. patent application Ser. No. 11/535,859, filed Sep. 27, 2006 (now U.S. Pat. No. 7,782,072). The foregoing U.S. patent application Ser. No. 11/535,859 is incorporated herein by reference in its entirety.

FIELD OF THE INVENTION

The present invention relates to testing semiconductor devices and more particularly to such testing in which a plurality of probe groups are used.

DESCRIPTION OF THE RELATED ART

Semiconductor devices, such as microprocessors, DRAM, and flash memory, are fabricated in a known manner on a semiconductor wafer. Depending upon the size of the wafer and of each device formed thereon, there may be as many as several thousand devices on a single wafer. These devices are typically identical to one another, each including a plurality of conductive pads on the surface thereof for power and other connections to the devices such as ground, input signals, output signals, control signals and the like.

It is desirable to test the devices on the wafer to determine which are fully functional, and therefore suitable for packaging and/or sale, and which are inoperative or partially functional, and therefore unsuitable for packaging and/or sale. To this end, wafer testers apply power and input signals to the devices and monitor outputs during a predetermined testing routine while the devices are still on the wafer.

Because each device under test (DUT) is substantially identical to the others, there is a plurality of identical DUT probe groups. Each DUT probe group includes probes that make discrete electrical contacts to separate ones of the pads on a corresponding DUT. The substrate with the probes can be part of a probe card assembly. The probe card assembly can be electronically connected to a tester, thus providing electrical connections between a tester and the various DUTs. The tester may include multiple channels, one for each probe.

It can be advantageous to provide a probe substrate having an increased capacity for probes. It can similarly be desirable to increase the probe density. It can further be desirable to improve the strength and durability of the probes in order to reduce probe fatigue, deformation, or fracture failure.

Figure 1:
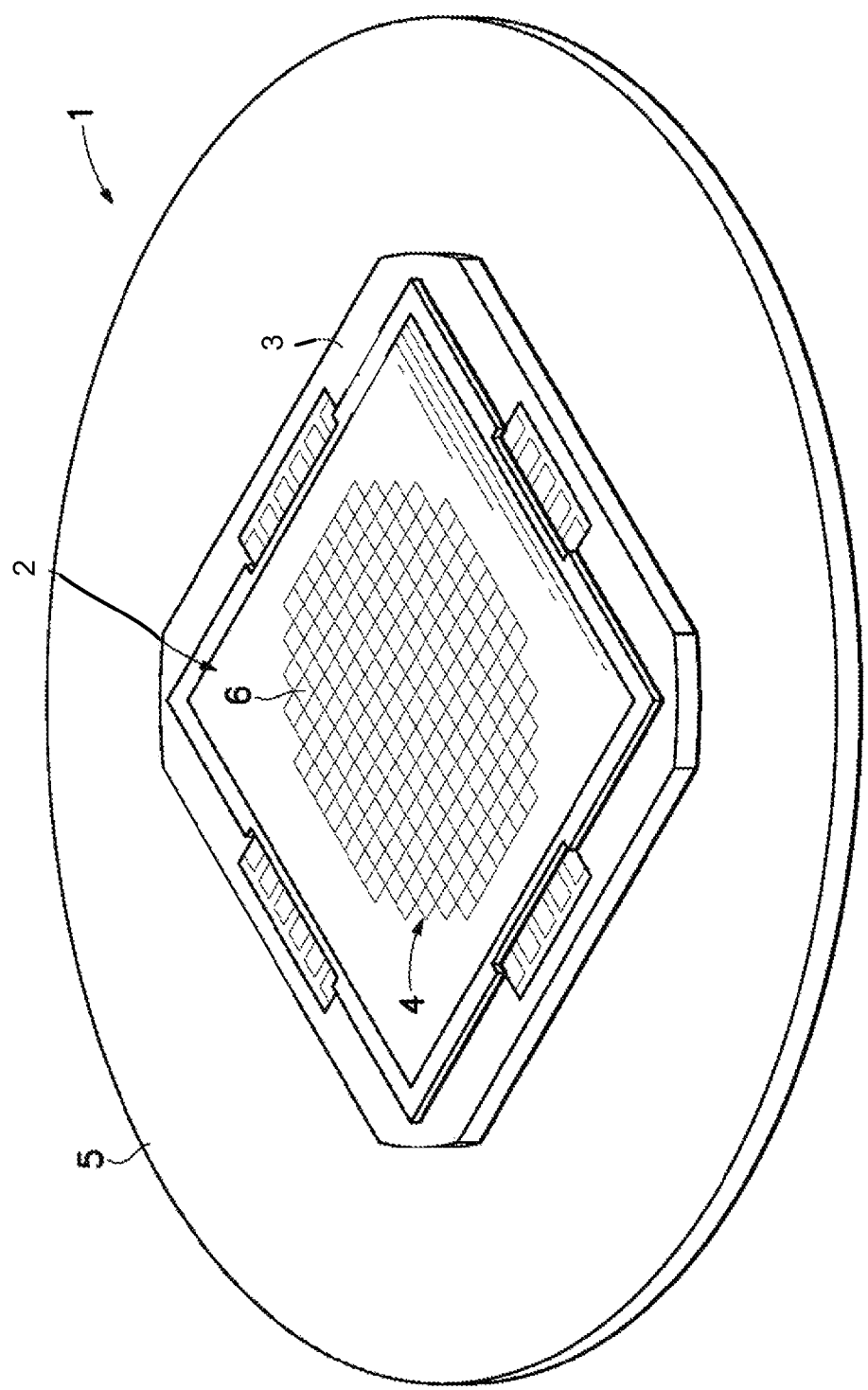
FIG. 1 is a perspective view of a probe card assembly including a probe substrate according to some embodiments of the invention.

The Figures presented in conjunction with this description are views of only particular—rather than complete—portions of the devices and methods of making the devices. Together with the following description, the Figures demonstrate and explain the principles of such devices and methods according to some embodiments of the invention. In the Figures, the thickness of layers and regions may be exaggerated in some instances for clarity. It will also be understood that when a layer is referred to as being "on" another layer or substrate, it can be directly on the other layer or substrate, or intervening layers may also be present. The same reference numerals in different drawings represent the same element, and thus their descriptions will be omitted.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein.

Figure 2:
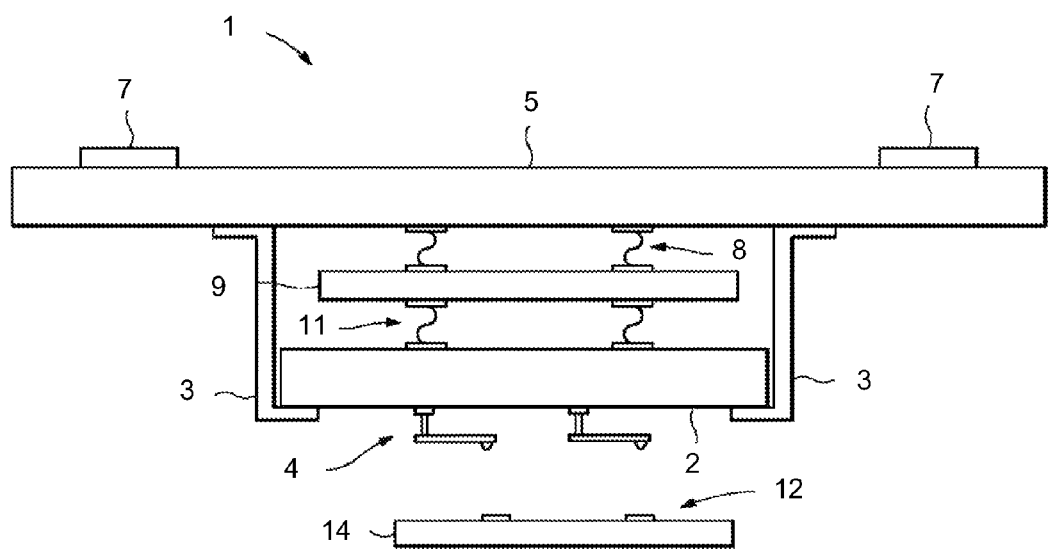
FIG. 2 is a simplified block diagram, side view of the probe card assembly of FIG. 1.

A non-limiting exemplary probe card assembly 1 illustrated in FIGS. 1 and 2 can be used to test one or more DUTs 14 in accordance with some embodiments of the invention. As used herein, the term "device under test" or "DUT," whether used in singular or plural form, refers to any electronic device or devices being tested or to be tested. Non-limiting examples of DUTs include one or more dies of an unsingulated semiconductor wafer, one or more semiconductor dies singulated from a wafer (packaged or unpackaged), an array of singulated semiconductor dies disposed in a carrier or other holding device, one or more multi-die electronics modules, one or more printed circuit boards, or any other type of electronic devices. FIG. 1 illustrates a lower portion of the probe card assembly 1 from a perspective view, and FIG. 2 illustrates a simplified, block diagram depiction of the probe card assembly 1 from a side view.

The probe card assembly 1 can act as an interface between a tester (not shown) and a DUT 14. The tester (not shown), which can be a computer or a computer system, can control testing of the DUT 14. For example, the tester (not shown) can generate test data to be input into the DUT 14, and the tester (not shown) can receive and evaluate response data generated by the DUT 14 in response to the test data.

As best seen in FIG. 2, probe card assembly 1 can include electrical connectors 7, which can make electrical connections with a plurality of communications channels (not shown) from the tester (not shown). Probe card assembly 1 can also include probes 4 configured to be pressed against and thus make electrical connections with input and/or output terminals 12 (e.g., contact pads or contact areas) of the DUT 14.

Probe card assembly 1 can also include one or more substrates configured to support connectors 7 and probes 4 and provide electrical connections between connectors 7 and probes 4. The exemplary probe card assembly 1 shown in FIGS. 1 and 2 can have three such substrates, although in other implementations, probe card assembly 1 can have more or fewer substrates. Shown in FIGS. 1 and 2 are a wiring substrate 5, an interposer substrate 9, and a probe substrate 2. Wiring substrate 5, interpose substrate 9, and probe substrate 2 can be made of any type of substrate. Examples of suitable substrates include without limitation a printed circuit board, a ceramic substrate, an organic or inorganic substrate, etc. Combinations of the foregoing are also possible. Probe substrate 2 can be referred to herein as a first substrate and interposer substrate 9 can be referred to herein as a second substrate.

Electrically conductive paths (not shown) can be provided from connectors 7 through wiring substrate 5 to electrically conductive spring interconnect structures 8. Other electrically conductive paths (not shown) can be provided from spring interconnect structures 8 through interposer substrate 9 to electrically conductive spring interconnect structures 11, and still other electrically conductive paths (not shown) can be provided from spring interconnect structures 11 through probe substrate 2 to probes 4. The electrical paths (not shown) through the wiring substrate 5, interposer substrate 9, and probe substrate 2 can comprise electrically conductive vias, traces, etc. on, within, and/or through wiring substrate 5, interposer substrate 9, and probe substrate 2.

Wiring substrate 5, interposer substrate 9, and probe substrate 2 can be held together by brackets 3 and/or other suitable means. The configuration of probe card assembly 1 shown in FIGS. 1 and 2 is exemplary only and is simplified for ease of illustration and discussion. Many variations, modifications, and additions are possible. For example, a probe card assembly 1 can have fewer or more substrates (e.g., substrate 5, 9, 2) than the probe card assembly 1 shown in FIGS. 1 and 2. As another example, the probe card assembly 1 can have more than one probe substrate (e.g., substrate 2), and each such probe substrate can be independently adjustable. Non-limiting examples of probe card assemblies with multiple probe substrates are disclosed in U.S. patent application Ser. No. 11/165,833, filed Jun. 24, 2005. Additional non-limiting examples of probe card assemblies are illustrated in U.S. Pat. Nos. 5,974,662 and 6,509,751 and the aforementioned U.S. patent application Ser. No. 11/165,833, filed Jun. 24, 2005, and various features of the probe card assemblies described in those patents and application can be implemented in the probe card assembly 1 shown in FIGS. 1 and 2.

Although two probes 4 are shown in the simplified, block diagram depiction of FIG. 2, many such probes 4 can be attached to the probe substrate 2, and the probes 4 can be arranged into groups (e.g., DUT probe groups). For example, the probes 4 in one group can be disposed to contact the terminals 12 of one DUT 14. Hereinafter, a group of probes 4 configured to contact the terminals 12 of one DUT 14 are referred to as a DUT probe group 6. In FIG. 1, DUT probe groups 6 are depicted schematically as squares, and as shown in FIG. 1, a plurality of such DUT probe groups 6 can be disposed on the probe substrate 2, which can comprise a multi-layer ceramic substrate that can include a ground plane and a power plane connected to the appropriate probes in each probe group for applying power to each DUT during testing. The probe substrate 2 can comprise any material. For example, substrate 2 can comprise, without limitation, one or a combination of the following materials: printed circuit board material, ceramics, organic materials, inorganic materials, plastics, etc.

Figure 3:
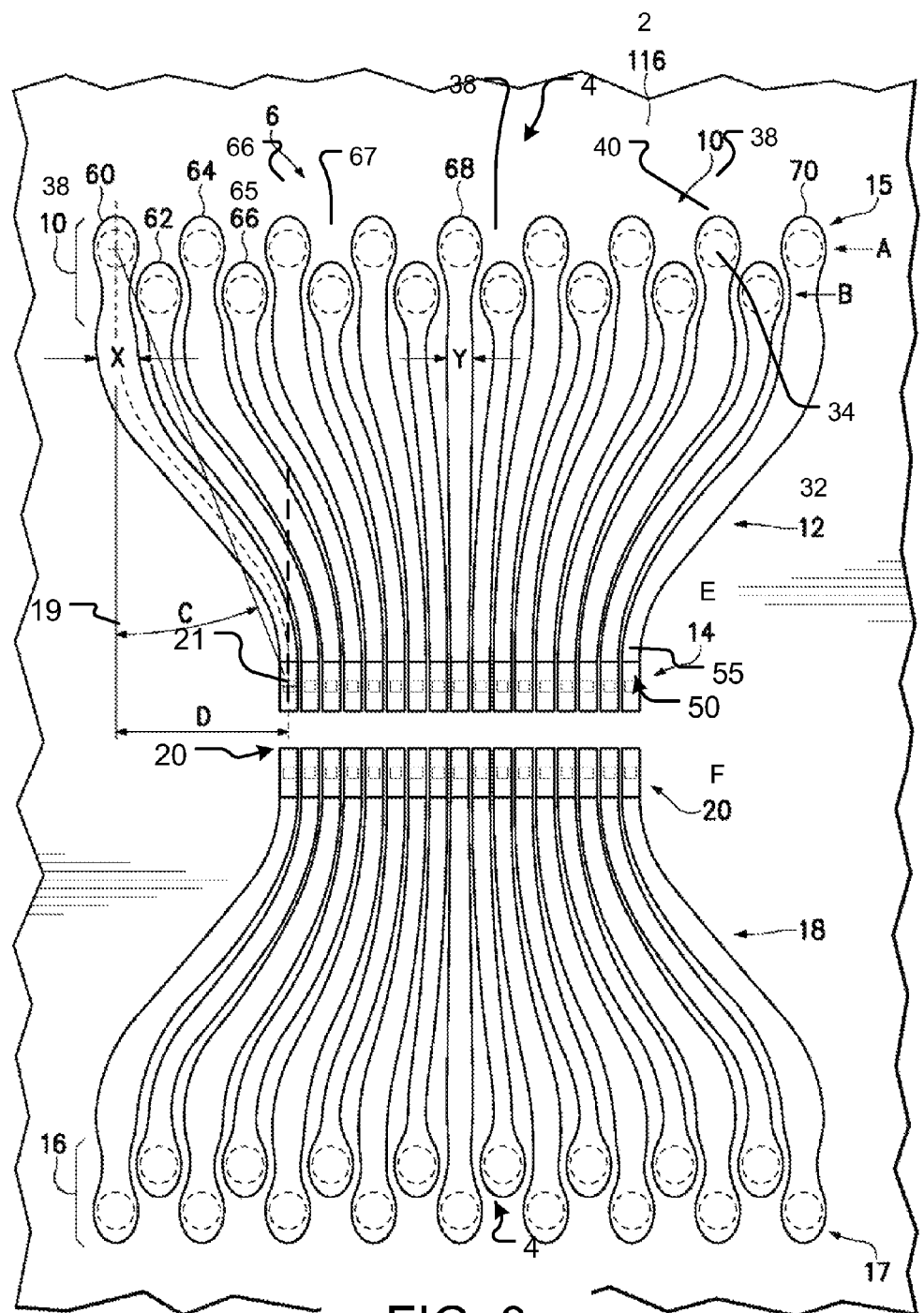
FIG. 3 is a top view of a DUT probe group in accordance with some embodiments of the invention.

As mentioned, each of the DUT probe groups 6 can comprise a sufficient number of probes 4 disposed in a pattern to contact the terminals 12 of a DUT 14. FIG. 3 illustrates a non-limiting exemplary number and pattern of probes 4 in an exemplary DUT probe group 6 according to some embodiments of the invention. As stated, the number and pattern of probes 4 as well as the shape and positioning of the probes 4 shown in FIG. 3 is exemplary only, and a DUT probe group 6 can have a different number, pattern, shape, and positioning of probes in other configurations or embodiments.

The DUT probe group 6 can comprise partial probe groups 15, 17 as shown in FIG. 3. Although two partial probe groups 15, 17 are shown as composing DUT probe group 6 in FIG. 3, more or fewer partial probe groups can compose a DUT probe group. Moreover, the total number of probes 4 in a DUT probe group 6 can be different than shown in FIG. 3. A DUT probe group 6 may include 60 to 80 or more probes 4, for example, although less or more may also be included. Because identical DUTs are typically tested simultaneously in many test applications, the DUT probe groups 6 on probe card assembly 1 (see FIG. 1) can also be identical to one another. For example, if the DUTs being tested are dies of a semiconductor wafer, the dies can be identical, and many such dies can be tested simultaneously.

As shown in FIG. 3, the probes 4 in partial probe group 15 may each include a mounting portion 38 (e.g., a mounting feature, a landing region, or a curved portion), a beam 32 (e.g., a beam portion or a resilient portion) and a contact tip structure 50, which can include a tip portion 55 configured to contact terminals (e.g., like terminals 12 of FIG. 2) of a DUT (e.g., like DUT 14 of FIG. 2). Similarly, the probes 4 in partial probe group 17 can each include a mounting portion 16 (e.g., a mounting feature, a landing region, or a curved portion), a beam 18 (e.g., a beam portion or a resilient portion), and a contact tip structure 20, which can be generally similar to like named elements of the probes in partial probe group 15. DUT probe group 6 can be arranged such that the contact tip structures 20, 50 are in one or more rows. For example, it may be desirable to arrange the contact tip structures 50, 20 of the probes 4 in aligned and adjacent rows E and F as shown in FIG. 3. The contact tip structures 50, 20 can be arranged to correspond to the alignment of the corresponding terminals 12 of a DUT 14 to be tested. Multiple partial probe groups (e.g., like 15, 17) may be arranged such that the different beams 32 and 18 and mounting portions 38 and 16 may be strategically located to facilitate placement of the contact tip structures 50 and 20 in the aligned rows E and F. It should be appreciated, however, that some embodiments can be implemented with contact tip structures (e.g., 50, 20) arranged in any pattern, including curved, circular, rectangular, square, and other patterns that may be necessary or desirable. Any number of partial probe groups 15, 17 may be provided to assist in creating a DUT probe group (e.g., like 6), and examples of various DUT probe group arrangements are further described in other patents assigned to the assignee of this document, such as U.S. Pat. No. 6,268,015.

During wafer testing, for example, terminals 12 of a DUT 14 can be aligned and brought into contact with ones of probes 4 (usually by the wafer being moved up). The probes may be manufactured as described in U.S. Pat. No. 6,520,778. Other manufacturing materials known in the art may also be used. The present invention may be equally well implemented in connection with testing DUTs that are dies singulated from the wafer on which the dies were manufactured, and more or fewer than all of the dies manufactured on a wafer can be tested in such scenarios.

Referring to FIGS. 2 and 3, as generally discussed above, each of the probes 4 in the DUT probe groups 6 can be connected via different electrical paths through substrates, such as probe substrate 2, interposer substrate 9, and wiring substrate 5 to the electrical connectors 7. There may be many (e.g., hundreds or thousands) of such electrical paths between the electrical connectors 7 and the probes 4. Electrical connectors 7 on the wiring substrate 5, can thus be used to connect each probe 4 on a probe card assembly 1 to a communications channel to and/or from a tester (not shown). As mentioned, DUT 14 can be one or many dies on a semiconductor wafer, and in such a case, each of the DUTs 14 manufactured on the same wafer can nevertheless vary as a result of a number of different factors, e.g., different manufacturers, different products, different testers, different wafer sizes, etc. As a result, probe substrate 2, including the number, pattern, and placement of probes 4, may be designed according to the pattern of terminals 12 on the particular DUT 14 to be tested.

Figure 4:
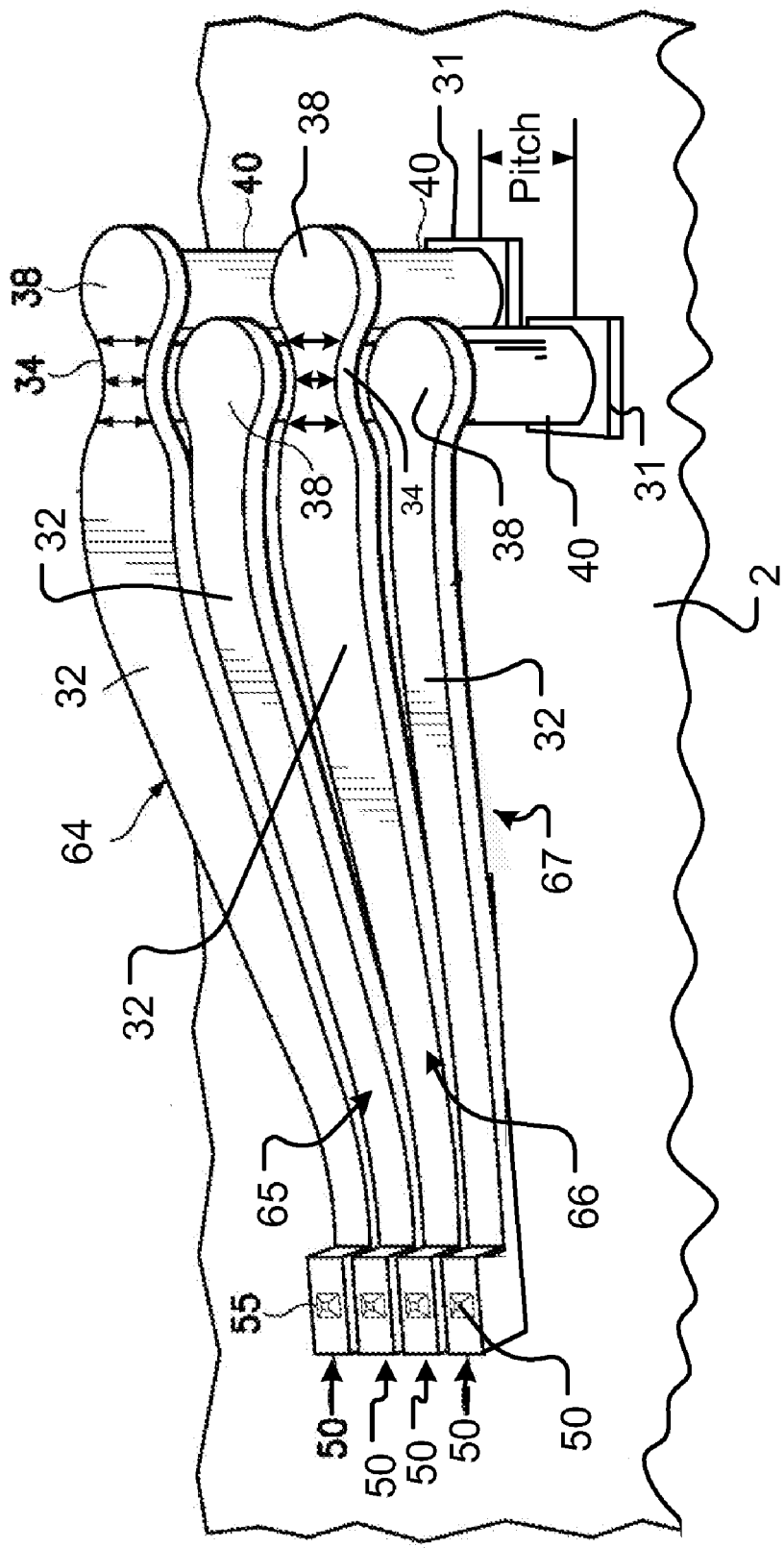
FIG. 4 is a perspective view of a portion of the DUT probe group of FIG. 3.

As shown in FIG. 3, probes 4 in the partial probe group 15 can include probes 60, 62, 64, 65, 66, 67, 68, 70, among other probes 4. Referring to FIG. 4 (which shows a perspective view of probes 64, 65, 66, 67 of the partial probe group 15 of FIG. 3), each of probes 64, 65, 66, 67 can include a contact tip structure 50 with a tip portion 55, a beam 32 with a mounting portion 38, and a support structure 40 according to some embodiments of the invention. The mounting portion 38 of each probe 64, 65, 66, 67 can be attached to a support structure 40, which in turn may be connected to the substrate 2. For example, as shown in FIG. 4, each support structure 40 can be attached directly to a terminal 31, which can be attached to the probe substrate 2. Alternatively, each support structure 40 can be attached directly to a surface of the probe substrate 2. Terminals 31 can be electrically conductive and can be connected to wiring (e.g., traces and or vias) on or within the probe substrate 2. The tip portion 55 can be placed against a terminal 12 of a DUT 14 (see FIG. 2) to test the DUT 14 (e.g. to test all or part of circuitry of the DUT 14). The beam 32 of each probe 4 can be configured to be resilient and can comprise a spring structure of each probe 4 in FIG. 3, which can provide controlled deflection of the beam 32 and thus of the probe 4. Beam 32 can connect the support structure 40 to a contact tip structure 50. Although FIG. 4 and others show one shape of contact tip structure 50 and tip portion 55, the concepts embodied herein apply equally well to contact tip structures and contact tips of other shapes and are within the scope of embodiments of the invention.

Figure 5:
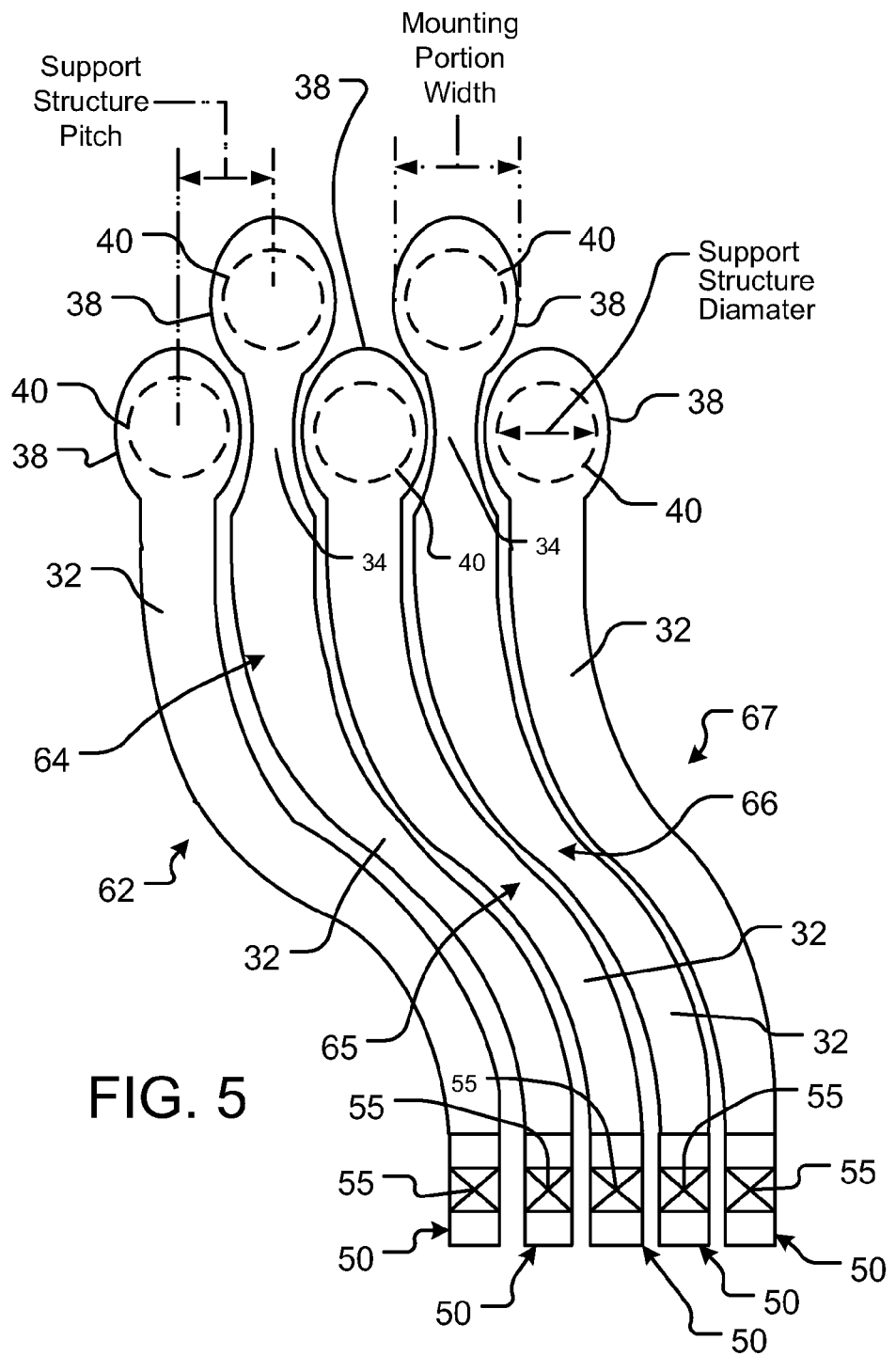
FIG. 5 is a top view of a portion of the DUT probe group of FIG. 3.

In some embodiments, the mounting portion 38 of each beam 32 can be oblong, oval, or circular shaped and can mount to a support structure 40. As shown in FIGS. 3, 4, and 5 (FIG. 5 shows a top view of probes 62, 64, 65, 66, 67), the locations of the support structures 40 and thus the mounting portions 38 can be staggered. Beams 32 of ones of the probes 4 (e.g., probes 64, 65 in FIGS. 4 and 5) can include a narrowing region 34 (e.g., a narrowing section) adjacent the mounting portion 38 of the beam. As shown, the narrowing region 34 can comprise a narrowing shape such as a concave shape. In the examples shown in FIGS. 4 and 5, probes 64, 66 include such a narrowing region 34, which includes lateral dimensions depicted by the arrows spanning beam 32 in the narrowing regions 34 in FIG. 4. As can be seen, the narrowing region 34 can be narrower than the mounting portion 38 of the beam 32 and can also be narrower than a mounting portion 38 portion of an adjacent beam 32. In this manner, the beams 32 of ones of the probes (e.g., probes 65, 67 in FIGS. 4 and 5) can include portions (e.g., mounting portions 38) on either side of the narrowing region 34 of one or more adjacent beams 32 that are wider than the narrowing region 34 of one or more adjacent beams 32. The mounting portion 38 (which can have a generally oblong shape) and the narrowing region 34 of a beam 32 together can define a generally oval shape.

As shown, each beam 32 may taper from a first end (e.g., corresponding to the mounting portion 38) toward a narrower second end (e.g., corresponding to the contact tip structure 50). In one embodiment, the narrowing region 34 may further be described as being concave in appearance. Other shapes (e.g., triangular) could be used. It is sufficient that the shape provides a narrowing result on at least one side of the narrowing region 34.

As shown in FIGS. 3-5, advantageously, adjacent probes 4 can be disposed in a staggered pattern, and the mounting portion 38 of one probe 4 (of which probes 62, 65, and 67 are examples), or the support structure 40 to which the mounting portion 38 is attached, can be positioned adjacent the narrowing region 34 of an adjacent probe 4 of which probes 60, 64, and 66 are examples). For example, as best seen in FIG. 5, the narrowing region 34 of probe 64 can be positioned adjacent the mounting portion 38 of probe 62 and the mounting portion 38 of probe 65. Similarly, the narrowing region 34 of probe 66 can likewise be positioned adjacent the mounting portion 38 of probe 65 and the mounting portion 38 of probe 67. As best seen in FIG. 5, the narrowing regions 34 can include a shape that is generally or approximately an inverse of a portion of the shape of the mounting portion 38 of an adjacent probe, which allows the mounting portions 38 of adjacent probes 4 (of which support structures 62, 64, 65, 66, 67 are examples) to be staggered as best seen in FIG. 5. In this manner, the diameter of a support structure (labeled "support structure diameter" in FIG. 5) can be made nearly equal to, equal to, or even greater than the support structure pitch (e.g., the distance between adjacent support structures, as shown in FIG. 5). As also shown in FIG. 5, the support structure pitch can be less than the width (labeled "mounting portion width" in FIG. 5) of a mounting portion 38. This allows larger clearance for support structure fabrication. Moreover, without staggering, the support structure pitch would be the same as beam separation, and it would not be possible to increase support structure diameter larger than the beam pitch.

The staggered support structure location, however, can cause the probes 4 to have different beam 32 lengths, which can result in beams 32 having different spring constants. In some applications, it is useful to provide probes 4 having similar spring constants when uniform contact characteristics are desired. In order to achieve similar spring constants, the beam width can be used to compensate for variations in beam length and position. The longer the beam length, the wider the beam to achieve a similar spring constant.

Figure 6:
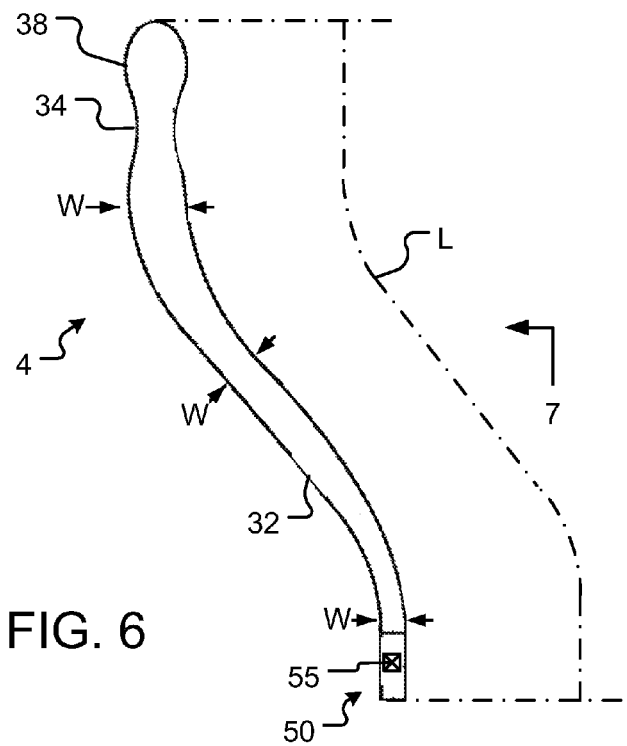
FIG. 6 is a top view of an exemplary probe of the DUT probe group of FIG. 3.
Figure 7:
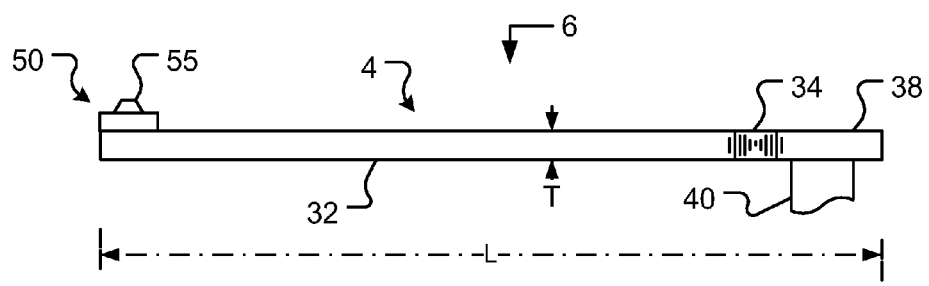
FIG. 7 is a side view of the exemplary probe of FIG. 6.

FIG. 6 illustrates a top view and FIG. 7 illustrates a side view of an exemplary probe 4. As shown in FIG. 6, the length L of the beam 32 of probe 4 can run from one end (e.g., the mounting portion 38 end) to the other end (e.g., the contact tip structure 50 end) of the beam 32. A width W parameter of the beam 32 is illustrated in FIG. 6, and a thickness T parameter of the beam 32 is illustrated in FIG. 7. As shown in FIG. 6, the width W parameter can vary along the length L of the beam 32. Although not shown in FIG. 7, the thickness T parameter can also vary along the length L of the beam 32. As mentioned, to compensate for different beam 32 lengths L in the probes 4 in the DUT probe group 6 of FIG. 3, the widths W of the beams 32 can be varied so that the spring constants of the probes 4 are the same or are approximately the same (e.g., within a tolerance specified for a particular application of the probes 4). As is known, the spring constant of a probe (e.g., like probe 4) is, according to Hooke's law: k=F/d (where k is the spring constant, d is the distance application of a force F displaces the probe, and / represents division).

One non-limiting exemplary method for determining widths W for each of the probes 4 in the DUT probe group 6 of FIG. 3 to compensate for different beam 32 lengths L is as follows. As is known, the spring constant of a cantilever beam with a rectangular shape (and thus a non-varying width W) and a rectangular cross section (and thus a non-varying thickness) can be calculated as follows: $k=(E*W*T^3)/(4L^3)$ (where k is the spring constant, E is Young's modulus, W is the width of the beam, T is the thickness of the beam, L is the length of the beam, and / represents division). Although most if not all of the beams 32 of the probes 4 in the DUT probe group 6 of FIG. 3 are not rectangular, the foregoing equation can nevertheless be used to estimate the spring constant of the beams. Referring to the exemplary probe 4 shown in FIGS. 6 and 7, the spring constant k of the probe 4 can be estimated using an average width W of the beam 32 along its length L. The average width can be determined, for example, from widths determined at multiple points along the beam 32. In the example shown in FIG. 6, three points are shown at which the width W of beam 32 can be determined, although the width W of beam 32 can be determined at more or fewer points. The spring constant k of the probe 4 shown in FIGS. 6 and 7 can therefore be approximated as follows: $k=(E*W_{ave}*T^3)/(4*L^3)$ (where k is the spring constant, E is Young's modulus for the material or materials of which the beam 32 is made, $W_{ave}$ is the average width W of the beam 32 along its length L, T is the thickness T of the beam 32, L is the length L of the beam 32, / represents division, and * represents multiplication). The average width $W_{ave}$ of each beam 32 of each probe 4 in the DUT probe group 6 in FIG. 3 that will cause the probes 4 to have approximately the same spring constant k can be determined as follows for each probe 4: $W_{ave}=(4*k*L^3)/(E*T^3)$ (where k is the spring constant, E is Young's modulus of the material or materials of which the beam 32 is made, $W_{ave}$ is the average width W of the beam 32 along its length L, T is the thickness T of the beam 32, L is the length L of the beam 32, / represents division, and * represents multiplication).

In the foregoing example, it is assumed that the thickness T of the beams 32 is the same from probe 4 to probe 4, and the spring constant k is tailored by varying the width W of each beam 32. Alternatively, the width W of each beam 32 can be held constant, and the thickness T of each beam 32 can be varied to achieve the same or similar spring constants k among the probes 4 despite different beam 32 lengths L. As yet another alternative, both the width W and the thickness T of the beams 32 can be varied from probe 4 to probe 4 in order to achieve the same or similar spring constants k among the probes 4 despite different beam 32 lengths L. If the thickness T of a beam 32 varies along the length L of the beam 32, the average thickness along the length L of beam 32 can be used in the above formulas.

Referring again to FIG. 3, spacing between tip portions 55 located at the contact tip structures 50 of the probes 4 can be varied according to the lateral curvature of the beams 32, even when the support structures 40 at the mounting portion 38 remain uniformly spaced. For example, although not shown, the distance between tip portions 55 of probes 64, 65, 66, 67 in FIG. 4 need not be the same. For example, the distance between the tip portions 55 of probes 64 and 65 can be different than the distance between the tip portions 55 of probes 66 and 67, even though their respective support structures may have a uniform support structure pitch.

Still referring to FIG. 3, the single support structure mounting design and beam 32 curvature of probes 4 can provide for a beams 32 offset angle C that may be greater than 45 degrees. As shown in FIG. 3, the beam offset angle C can provide an offset distance D for probe 60 (which is one of the probes 4 of the DUT probe group 6 shown in FIG. 3). Offset distance D may be measured as the distance from a support structure 40 centerline 19 to a longitudinal axis 21 of a respective contact tip structure 50. Distance D is referred to herein as a lateral offset or simply an offset. As can be seen, probe 60 can be longer and can have a greater lateral curve than a central probe 68. In addition, probe 60 has a width at one location, designated X in FIG. 3, that can be wider than probe 68, the width of which is designated Y in FIG. 3 at, for example, a corresponding distance from its mounting portion 38. As discussed above, controlled varying of the widths of the beams of the probes 4 can permit control of the spring constant of each probe 4. In this manner, probes 4 having varying lengths and curvatures may be formed to have substantially similar spring constants. In some embodiments, probes 4 whose support structures 40 are further from a center support structure (e.g., a support structure 40 of probe 68) can have an increasing beam width along at least a portion of its contour as compared to, for example, probe 68 to compensate for the longer beam length yet achieve a substantially similar spring constant.

Still considering FIG. 3, probes 60, 62, 64, 65, 66, 67, 68, 70 are shown as having mounting portions 38 disposed in a Row A (e.g., a first row) or a Row B (e.g., a second row). Specifically, probes 60, 64, 66, 68 70, among others, are mounted on support structures 40 in Row A, and probes 62, 65, 67 are mounted on support structures in Row B. In the example shown, the mounting portions 38 of each of the probes in Row B can be located adjacent to a narrowing region 34 of a probe 4 in Row A.

The support structure pitch in Row A (e.g., the distance between the centers of adjacent support structures 40 in Row A) can be the same as the support structure pitch in Row B (e.g., the distance between the centers of adjacent support structures 40 in Row B). In fact, the support structure pitch between any two adjacent support structures 40 shown in FIG. 3 may be the same. Of course, the support structure pitch can be made to vary between any adjacent support structures 40. Similarly, less than and more than two rows are contemplated such that narrowing regions 34 may exist in two or more of the rows, having mounting portions 38 located adjacent the narrowing regions.

As can be seen, the outer probes 60, 70 in partial probe group 15 can have beams that together form a substantially symmetric laterally curved beam pair. Alternatively, the outer probes 60, 70 need not form a symmetric curved beam pair. The beam for center probe 68 can be substantially straight, or alternatively, can also be curved. As can be seen in FIG. 3, there can be a plurality of laterally curved beam pairs on either side of the beam in probe 68. Again, however, there need not be symmetry between any beam pair in the partial probe groups 15, 17 shown in FIG. 3. As previously stated, the number, pattern, spacing, etc. of probes 4 shown in FIG. 3 is exemplary only, and other numbers, patterns, spacings, etc. of probes 4 can be used. In some embodiments, the number, pattern, spacing, etc. of probes 4 can depend on the number of DUT terminals to be contacted.

In any of the foregoing examples, support structures 40 can be replaced with multiple support structure constructions. For example, one or more of the support structures 40 can be replaced with a structure that comprises two support structures, and a mounting portion 38 of a beam 32 can be attached to the two support structures. Nevertheless, a single support structure configuration, such as support structures 40, can provide advantages in some embodiments.

Figure 8:
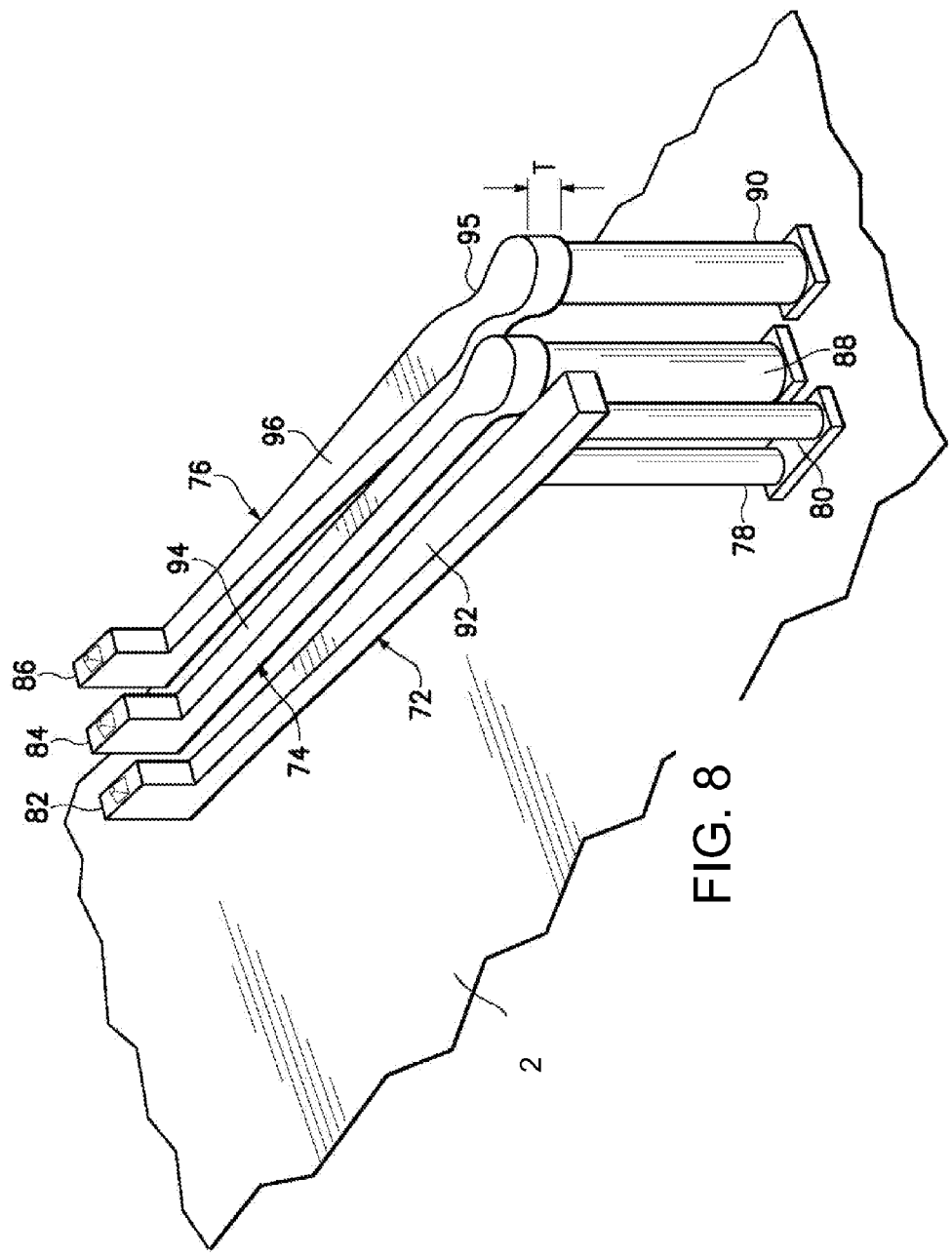
FIG. 8 is a perspective view of a plurality of probes contrasting a two-support structure probe with a one-support structure probe according to some embodiments of the invention.

FIG. 8 shows three example probes 72, 74 and 76 (which can be like probe 4) with beams 92, 94 and 96 (which can be like beams 32), respectively. Single support structure beams 74, 76 are shown adjacent double support structure beam 72 more to illustrate some of the advantages of some of the various embodiments of the invention than to illustrate construction of a probe group. It is assumed for this example that all three beams 92-96 have the same thickness T, such that a spring constant of the beams is a function of length and width (e.g., in accordance with Hooke's law), with length being the longer dimension. Of course, the thickness T of the beams may also be varied in order to influence the spring constant. It is further noted that each of the probes 72-76 include contact tip structures 82, 84 and 86 (which can be like contact tip structures 50) as well as support structures 78, 80, 88 and 90 (which can be like support structures 40). Support structures 88 and 90 associated with probes 74 and 76, respectively, are shown with a single support structure, whereas the two-support structure probe 72 includes two smaller support structures 78 and 80 mounted in-line with the beam 92. The support structures 78 and 80 may be identified as part of a two-support structure design approach.

Figure 9:
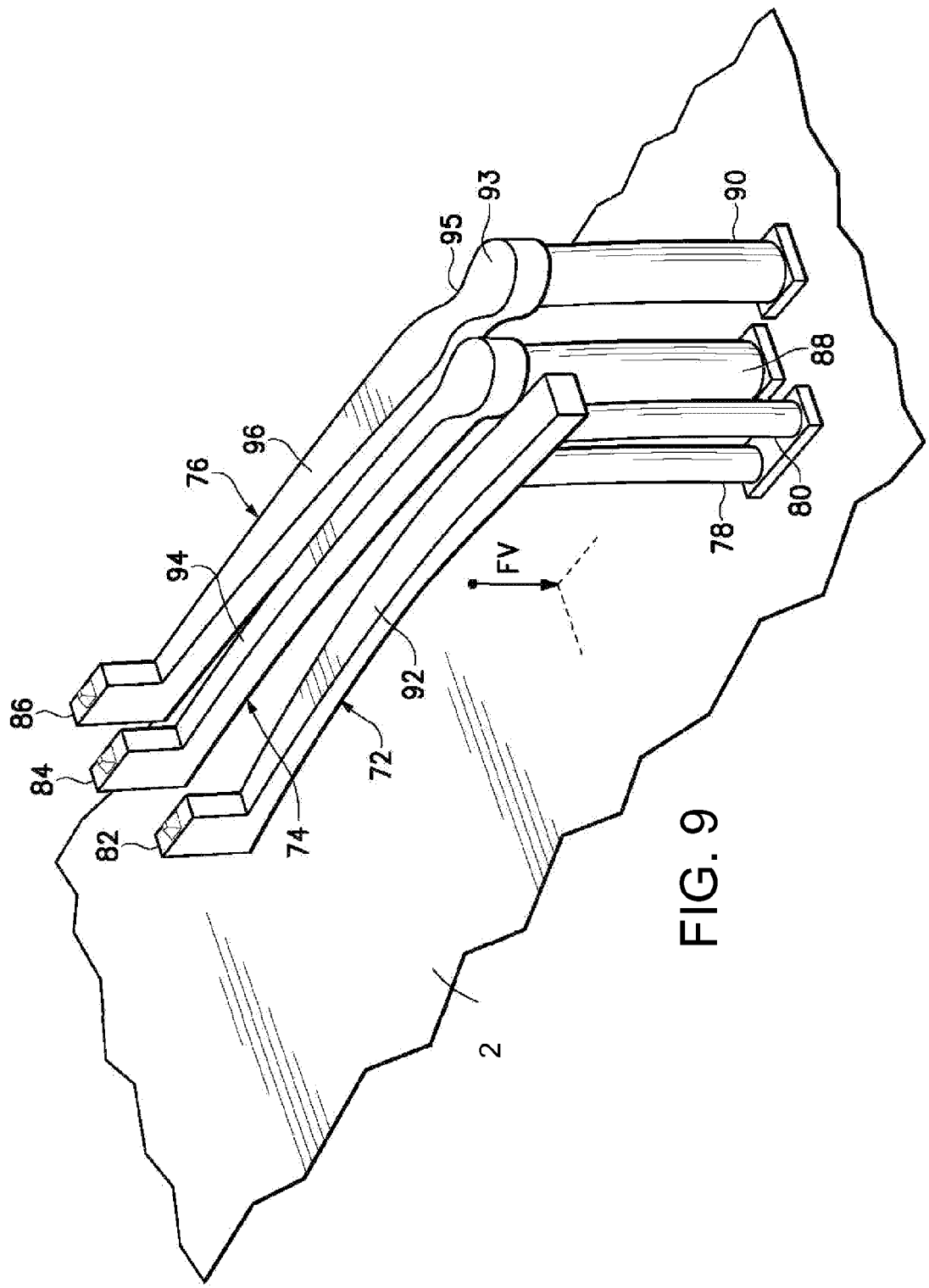
FIG. 9 is a perspective view of the probes shown in FIG. 8 illustrating deflection of the two-support structure probe in a vertical direction.

FIG. 9 shows the same probes 72-76 as shown in FIG. 8, but with a force FV being applied vertically to the contact tip structure 82. As can be seen from the figure, beam 92 is deflected in a vertical direction in proportion to the force FV. As previously described, a similar spring constant may be obtained for probes 74 and 76 by tuning their widths even though their relative beams 94 and 96 are of different length. Thus, if the beams 94, 96 are configured to have the same or a similar spring constant as the beam 92, the force FV can deflect beams 94 and 96 the same or a similar distance as the force FV deflects beam 92.

An advantageous feature of the narrowing region 95 is that a similar spring constant may be obtained despite a decreased support structure pitch compared with conventional probe groups known in the art. The narrowing region 95 may be designed to further concentrate or absorb some of the bending stress such that the stress is reduced between the landing region 93 (which can be like mounting portion 38) and the support structure 90. The narrowing region 95 (which can be like narrowing region 34) further provides for the increased support structure pitch by alternating support structures 88 and 90. In other words, an increased probe density is made possible without sacrificing probe strength.

Those skilled in the art will appreciate that it is desirable that the spring constant associated with each of the probes 72-76 may be made substantially similar. Although beam length is shown to vary, beam width may also be made to vary such that the resultant spring constant k for each probe 72-76 is made substantially similar, as discussed above. In particular, it is noted that the relative width of beam 96 is greater than that of beam 94, such that even though beam 96 is longer than beam 94, their relative constants may be made substantially similar through beam width tuning. Similarly, the width of beam 92 may be selected such that the two-support structure probe 72 having multiple support structures 78 and 80 likewise may have the same spring constant as the other probes 74 and 76.

Figure 10:
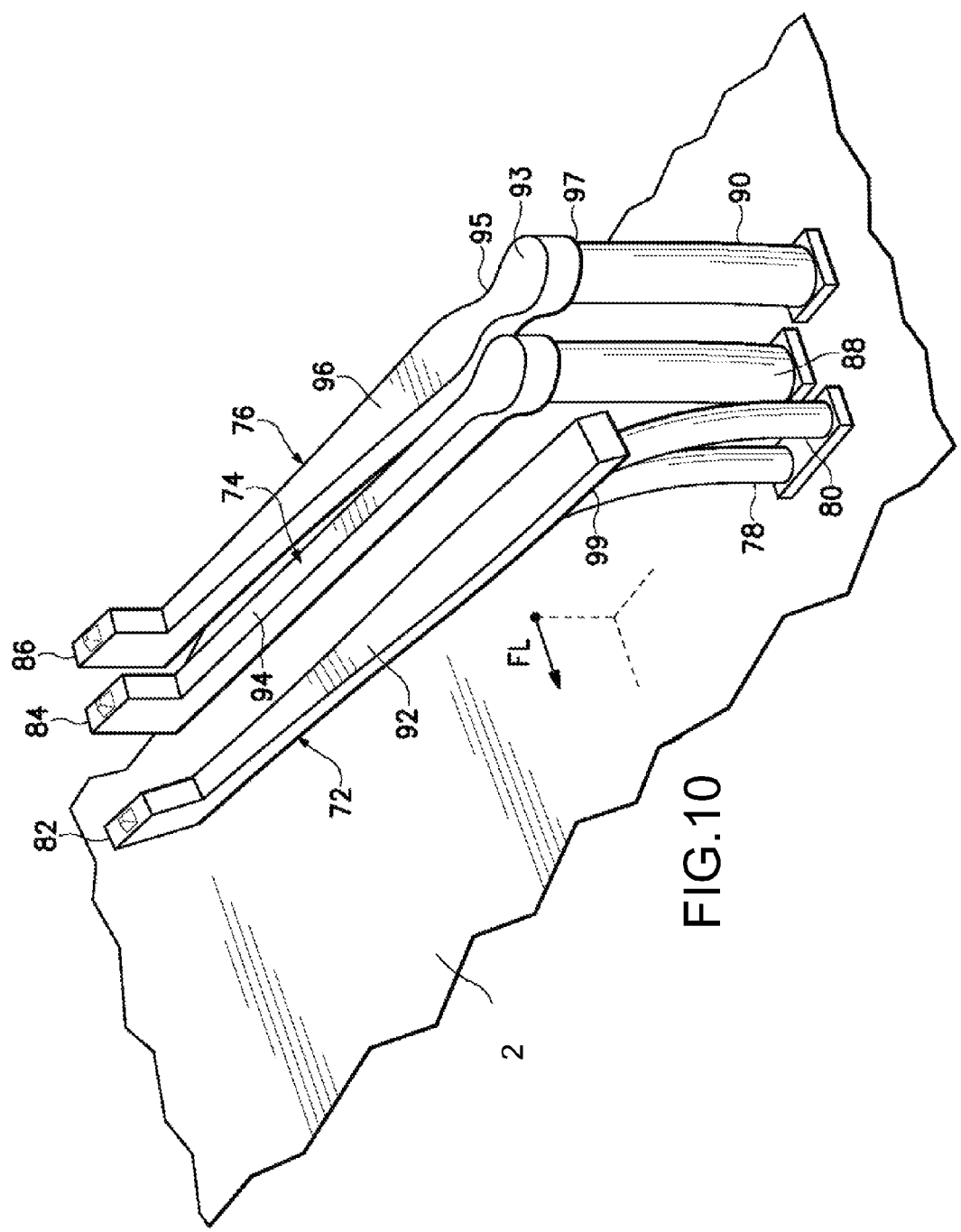
FIG. 10 is a perspective view of the probes shown in FIG. 8 illustrating deflection of the two-support structure probe in a lateral direction.

Whereas the vertical force FV exerted on the contact tip structures 82-86 during testing may provide for advantageous flexing of beams 92-96, a lateral force FL may also be exerted on the contact tip structures 82-86 either inadvertently (such as during manufacturing or shipment) or during the testing process itself. FIG. 10 demonstrates the effect of the lateral force FL as applied to each of the contact tip structures 82-86 of associated probes 72-76. Contact tip structure 82 associated with the two-support structure probe 72 having multiple support structures 78 and 80 is seen to be displaced in the lateral direction significantly more than either of the probes 74 and 76 having single support structures 88 and 90. This deflection substantially contributes to the lateral displacement of the contact tip structure 82 as compared to contact tip structures 84 and 86. The stiffness of the support structure is determined as a function of the fourth power of the support structure diameter, such that doubling the support structure diameter would result in advantageously increasing the support structure stiffness by 16 times.

The increased lateral displacement existing in the two-support structure mounting system may represent an increased likelihood of probe failure when the contact tip structure 82 is exposed to heavy lateral forces. This failure could be manifested in a fracturing of the probe, loss of contact between the probe and the DUT, joint failure, or increased contact scrubbing for example. Therefore, by having a larger diameter, support structures 88 and 90 are deflected less than support structures 78 and 80, and as a result contact tip structures 84 and 86 are laterally displaced less than contact tip structure 82. It has been found to be advantageous to double the support structure diameter found in a dual-support structure probe, although other diameters can also be utilized.

Increased support structure stiffness has the further benefit of reducing the amount of scrub ratio on the DUT terminal, by reducing the amount of undesirable lateral movement of the contact tip structures 84 and 86 during contact of the probes 74 and 76 with the DUT terminals.

Another advantage of a single support structure design as compared to a two-support structure or multiple support structure design is that it is easier to produce greater beam curve when larger beam offsets are involved. Additionally, the single support structure design may result in significantly fewer support structures, up to a 50% reduction, being required to support the probes.

A further advantage may be found in the oblong shaped mounting portion 93. The landing pad provides for increased contact area for the beam 96 to attach to the support structure 90, and therefore provides greater resistance to separation of the beam 96 from the support structure 90 when a force FL or FV is applied to the contact tip structure 86. For example, doubling the support structure diameter results in a fourfold increase of contact area.

Additionally, the oblong shape of the mounting portion 93 contains the total volume of solder in a more natural and structurally strong spherical form, as naturally occurring due to surface tension of the liquid solder, and can reduce or in some cases prevent solder wicking down the beam and starving the solder joint of solder. This is a result of the curved shape of the beam adjacent its connection to the support structure. A straight beam, such as beam 72, permits solder to flow along the straight edges. A more reliable solder connection is therefore made possible by the oblong shape, which accommodates the spherical solder, and thereby reduces stress in a probe joint 97. Significantly, the narrowing region 95 of the probe 76 further reduces stress in the joint due to deflection of the beam 96 in the lateral direction, as the stress is more likely to concentrate at the narrowing region 95 instead of the joint 97. Those skilled in the art will appreciate that a reduction in joint 97 failure is advantageous.

The mounting portion 93 is further desirable in reducing solder bridging between support structures, such as support structures 88 and 90, which may otherwise result in probe failure. A rectangular mounting portion 99 of the two-support structure probe 72 is significantly less than that of landing pad area of probes 74 and 76, and furthermore does not provide as desirable of a surface area for promoting spherical solder connections. Solder that does not remain confined to the surface of the rectangular mounting portion 99 may bridge to an adjoining probe, such as probe 74.

Additionally, it will be obvious to those skilled in the art that a process used to develop the probes described herein can result in improvements to production yield and process cycle times in solder stencil. Furthermore, a reduction in solder stencil bridging and associated rework may be achieved. And, a stronger support structure and reliable joint result in less bend support structure repair. The connection from beam to support structure, however, is not limited to solder joint. The beam to support structure can be connected by epoxy, plating, welding, or other processes.

Whereas a single support structure, such as support structures 88 and 90, embodiment has been described, it should be apparent that the staggered mounting pattern including narrowing region 95 can be utilized using other mounting designs, including multiple support structures, lithographically-formed support structures, and support structures made with other techniques. As such, improved support structure pitch can be achieved for any of the mounting techniques.

As between embodiments utilizing a single support structure to support a beam of a probe and embodiments utilizing a plurality of support structures to support a beam, the single-support structure embodiments can permit reduced spring length, and the unsupported spring length can be a larger percentage of the overall length than with a multiple support structure architecture. Nevertheless, the invention contemplates use of multiple support structures to support one beam of one probe.

FIGS. 11-15 illustrate an exemplary method of making probes, like probes 4, in a DUT probe group, like DUT probe group 6.

Figure 11:
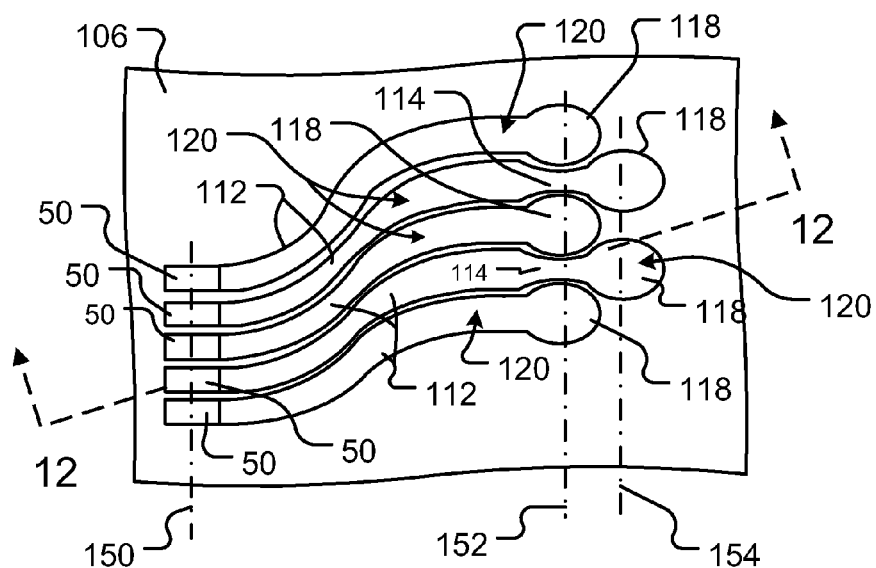
FIGS. 11-15 illustrate an exemplary process for making a plurality of probes according to some embodiments of the invention.
Figure 12:
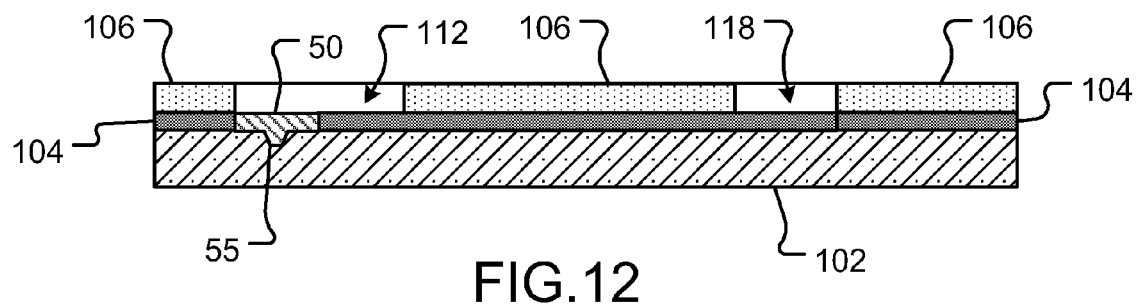

FIG. 11 shows a top, partial view, and FIG. 12 shows a side, cross-sectional view, of an exemplary removable substrate 102 on which has been deposited one or more layers of a patternable material. In the example shown in FIGS. 11 and 12, two layers of patternable material 104, 106 are shown, but more or fewer of such layers can be deposited on substrate 102. The patternable materials 104, 106 (which can also be referred to as masking materials) can be any material into which a pattern can be formed that defines a shape or shapes of portions of probes 4 to be made. For example, patternable material 104, 106 can be a photoreactive material, such as photo resist. The removable substrate 102 can be any substrate suitable for supporting the patternable materials 104, 106. For example, substrate 102 can comprise a semiconductor wafer, a printed circuit board, an organic substrate, an inorganic substrate, etc.

In the example shown in FIGS. 11 and 12, pits (not shown but corresponding to tip portions 55 in FIGS. 11 and 12) can be etched into the substrate 102 in a desired shape of the tip portions 55 of the probes 4 to be made, and a first layer of the patternable material 104 can be deposited and patterned to have openings (not shown but corresponding to contact tip structures 50 in FIGS. 11 and 12) 108 exposing the pits and formed in a shape of the contact tip structures 50 of the probes 4 to be made. Material can then be deposited into the openings in the material 104, forming the tip portions 55 and contact tip structures 50 of the probes 4 to be made as shown in FIGS. 13 and 14.

The material 106 can then be deposited and patterned to have openings 120 in a shape of the beams 32 of the probes 4 to be made. As shown, each opening 120 can include a portion 112 in the shape of a beam 32 and portion 118 in a shape of a mounting portion 38 of a probe 4 to be made. Ones of the openings 120 can also include portion 114 in the shape of the narrowing region 34 of a probe 4 to be made. As shown in FIG. 11, the contact tip structures 50 can be aligned in a first row 150. As also shown in FIG. 11, openings 120 can be disposed such that the portions 118 in which mounting portions 38 of ones of the beams 32 will be made are aligned in a row 152 (e.g., a second row) with portions 120 in which narrowing regions 34 of others of the beams 32 will be made. As also shown, the portions 118 of openings 120 in which mounting portions 38 of the beams 32 with narrowing regions 34 will be made can be aligned in row 154 (e.g., a first row).

Figure 13:
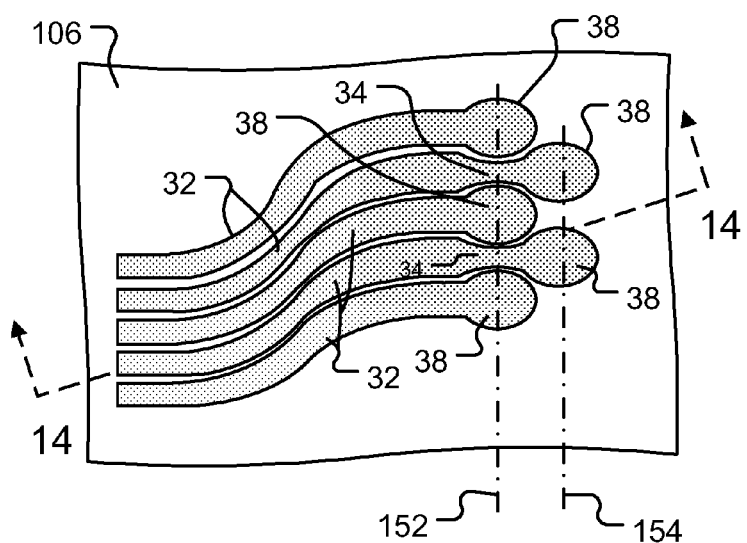
Figure 14:
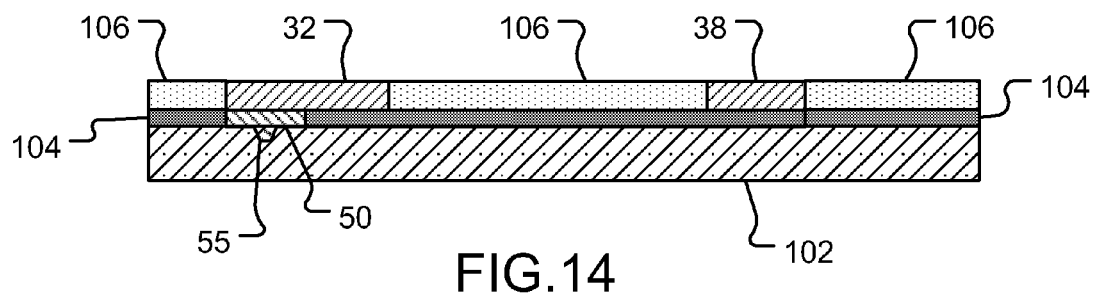

As shown in FIGS. 13 and 14, material can be deposited into the openings 120, forming beams 32. As discussed above, each of the beams 32 can comprise a mounting portion 38, and ones of the beams can comprise a narrowing region 34. Moreover, the mounting portion 38 of ones of the beams 32 can be aligned in a row 152 with the narrowing regions 34 of others of the beams 32, whose landing regions 34 can be aligned in another row 154, as shown in FIG. 13.

The material or materials deposited to form the contact tip structures 50 (including tip portions 55) and the beams 32 can be any material suitable for making contact tip structures 50 and beams 32. For example, such materials can be electrically conductive. Examples of such materials include without limitation palladium, gold, rhodium, nickel, cobalt, silver, platinum, conductive nitrides, conductive carbides, tungsten, titanium, molybdenum, rhenium, indium, osmium, rhodium, copper, refractory metals, and their alloys including combinations of the foregoing. The material or materials deposited to form the contact tip structures 50 and the beams 32 can be deposited by any method or means suitable for depositing such materials including without limitation electroplating, chemical vapor deposition, physical vapor deposition, sputter deposition, electroless plating, electron beam deposition, evaporation (e.g., thermal evaporation), flame spring coating, and plasma spray coating.

Figure 15:
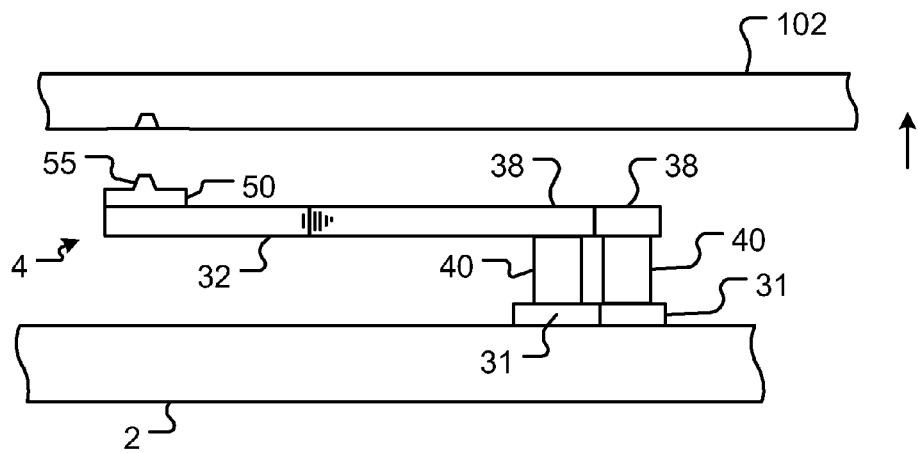

After the material or materials forming contact tip structures 50 and beams 32 are deposited, the patternable materials 104, 106 can be removed. The mounting portions 38 of the beams 32 can be attached to (e.g., by soldering (and thereby forming a solder joint), brazing, etc.) support structures 40 on a substrate (e.g., probe substrate 2) as shown in FIG. 15. As also shown in FIG. 15, the tip portions 55, contact tip structures 50, and beams 32 can be released from the removable substrate 102, leaving the beams 32 attached to the support structures 40, forming probes 4. Although five are shown in FIGS. 11 and 13, more or fewer of such probes 4 can be made on removable substrate 102. Indeed, one or more arrays of probes (e.g., like DUT probe group 6) can be fabricated on removeable substrate 102 in accordance with the process illustrated in FIGS. 11-15.

Figure 16:
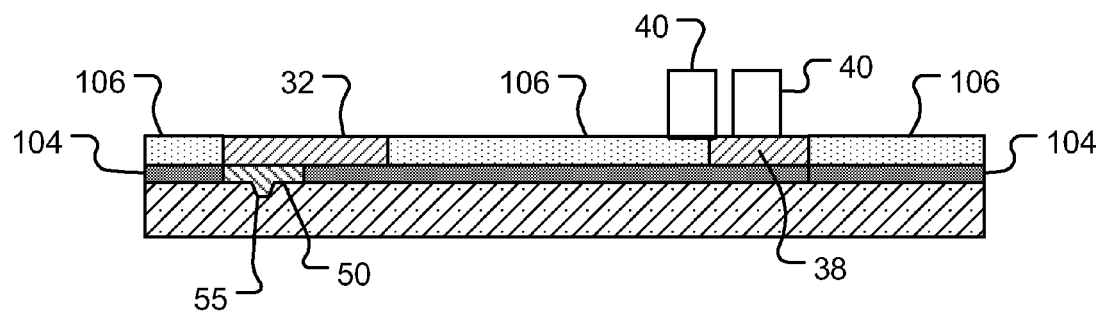
FIG. 16 illustrates exemplary variations in the process of FIGS. 11-15 according to some embodiments of the invention.

The method of making probes 4 illustrated in FIGS. 11-15 is exemplary only, and many variations are possible. FIG. 16 illustrates one such variation. FIG. 16 is generally similar to FIG. 14 (showing a tip portion 55, a contact tip structure 50, and a beam 32 formed in patternable materials 104, 106 on removable substrate 102). In FIG. 16, however, a support structure 40 is formed on the mounting portion 38 of each beam 32 while the beam 32, contact tip structure 50, and tip portion 55 are attached to the removable substrate 102. Thereafter, the materials 104, 106 can be removed, the support structures 40 can be attached to a substrate (e.g., like probe substrate 2), and the tip portions 55, contact tip structures 50, and beams 32 can be released from the substrate 102.

Whether formed on the substrate 2 or the removable substrate 102, the support structures 40 can comprise a wire column, a column formed by depositing material into an opening in a patternable material (e.g., like materials 104, 106), or any other column structure.

Having described and illustrated the principles of the invention in a preferred embodiment thereof, it should be apparent that the invention can be modified in arrangement and detail without departing from such principles. I claim all modifications and variation coming within the spirit and scope of the following claims.

The invention claimed is:

1. A plurality of probes for testing electronic devices, the probes comprising:
   contact tip structures disposed to contact the electronic devices;
   support structures; and
   resilient portions to which the contact tip structures are attached, the resilient portions providing for controlled deflection of the probes, the resilient portions comprising mounting features to which the support structures are attached,
   wherein the mounting features are arranged in a staggered pattern, and
   resilient portions located in a first row of the staggered pattern include narrowing sections that lie substantially in line with the mounting features of a second row of resilient portions.

2. The plurality of probes of claim 1 wherein the resilient portions vary in length depending on the distance from each of the mounting features to the corresponding contact tip structure.

3. The plurality of probes of claim 2 wherein the resilient portions vary in shape to determine a spring constant.

4. The plurality of probes of claim 3 wherein the spring constant is substantially the same for at least some of the probes whose resilient portions vary in length.

5. The plurality of probes of claim 1 wherein at least some of the resilient portions include mounting features that are offset from a longitudinal axis of a corresponding contact tip structure.

6. The plurality of probes of claim 5 wherein the offset is a result of curvature of the resilient portions and the degree of curvature is dependent on the number of probes arranged in a probe group.

7. The plurality of probes of claim 1 wherein the support structures are disposed on a substrate with a pitch that is less than the support structure diameter.

8. A probe for testing a circuit on an electronic device comprising:
   a beam; and
   a support structure attached to a first end of the beam, the beam including a narrowing section that is more narrow than both the first end of the beam and an adjacent section of the beam that is immediately adjacent the narrowing section,
   wherein:
   the narrowing section is between the first end and the adjacent section, and
   the narrowing section is configured to be located adjacent a separate support structure of a second probe.

9. The probe of claim 8 wherein the beam includes a curved portion where the support structure is attached.

10. The contact tip structure of claim 9 wherein the curved portion is oblong.

11. The apparatus of claim 8 wherein the beam includes a wide section that tapers to a second end, and the adjacent section of the beam is between the narrowing section of the beam and the wide section of the beam.

12. The probe of claim 8 wherein the beam further includes a second end that is offset from the support structure by an amount that is related to a curvature of the beam.

13. The probe of claim 8 wherein a width of the beam is selected to provide a selected spring constant.

14. A probe for making a connection with a contact area on an electronic device, the probe comprising:
   a support structure mounted at one end to a substrate;
   a beam mounted on another end of the support structure and extending laterally from the support structure; and
   a contact tip structure located on the beam,
   wherein the beam comprises a curved portion adjacent its connection to the support structure.

15. The probe of claim 14 wherein the curved portion comprises a substantially oblong curved portion that extends from one side of the support structure.

16. The probe of claim 15 wherein the beam further comprises a narrowing section formed on the beam on a side of the support structure substantially opposite the one side.

17. The probe of claim 16 wherein the oblong curved portion and the narrowing section together form a generally oval shape.

18. The probe of claim 17 wherein the probe further includes a solder joint formed between the beam and the contact support structure.

19. A method for making probes on a substrate comprising:
   applying at least one layer of patternable material on a surface of the substrate;
   patterning the patternable material to have openings that define:
      beams in a staggered pattern of at least two rows;
      a landing region of each beam for mounting the beam on a support structure; and
      a narrowing section of ones of the beams, the landing regions of the beams in a second of the rows being in line with the narrowing sections of the beams in a first of the rows; and
   depositing at least one conductive material in the openings.

20. The method according to claim 19 wherein the patternable material is patterned such that at least some of the beams include curved sections.

21. The method according to claim 19 wherein the patternable material is patterned to define beams in the second row that are shorter in length than adjacent beams in the first row.

22. The method according to claim 19 wherein the patternable material is patterned to provide a curved perimeter of each beam adjacent the landing region of each beam.

23. The plurality of probes of claim 1 wherein, for each of the resilient portions in the first row:
   the narrowing section is more narrow than both the mounting feature of the resilient portion and an adjacent section of the resilient portion that is immediately adjacent the narrowing section, and
   the narrowing section is between the mounting feature and the adjacent section.

24. The probe of claim 14, wherein, extending laterally from the support structure, the beam is in a plane from which the contact tip extends.

25. The probe of claim 24, wherein the curved portion is in the plane.

26. The method of claim 19 wherein:
   the narrowing section of the ones of the beams are disposed between the landing region and an adjacent section of the ones of the beam, and
   the narrowing section is wider than the landing region and the narrowing section.

* * * * *